United States Patent

Tamura et al.

[11] Patent Number: 6,042,971
[45] Date of Patent: Mar. 28, 2000

[54] METHOD OF MANUFACTURING AN EB MASK FOR ELECTRON BEAM IMAGE DRAWING AND DEVICE FOR MANUFACTURING AN EB MASK

[75] Inventors: Takao Tamura; Hiroshi Yamashita; Ken Nakajima; Hiroshi Nozue, all of Tokyo, Japan

[73] Assignee: NEC Corporation, Tokyo, Japan

[21] Appl. No.: 09/006,503

[22] Filed: Jan. 14, 1998

[30] Foreign Application Priority Data

Jan. 20, 1997 [JP] Japan ................. 9-007833

[51] Int. Cl.$^7$ ......................................... G03F 9/00
[52] U.S. Cl. ............................. 430/5; 430/296
[58] Field of Search ................ 430/5, 296; 250/492.2, 250/492.3

[56] References Cited

U.S. PATENT DOCUMENTS 5,249,197 9/1994 Sakamoto et al. ............. 250/492.22

FOREIGN PATENT DOCUMENTS 5 13313 1/1993 Japan.
5198483 8/1993 Japan.

*Primary Examiner*—S. Rosasco
*Attorney, Agent, or Firm*—Sughrue, Mion, Zinn Macpeak & Seas, PLLC

[57] ABSTRACT

The present invention consists in a method of creating an EB mask for electron beam image drawing, comprising: a step of extracting patterns for forming on an EB mask from design data stored in means for storage; a step of calculating an aperture area of an aperture section requested in an EB mask, using the design data contained in the extracted cell; a step of generating cell data for aperture creation using the value of this aperture area; and a step of forming a basic aperture pattern in an EB mask using this cell data for aperture creation.

17 Claims, 10 Drawing Sheets

| MINIMUM DIMENSION Lmin / PITCH P BETWEEN PATTERNS | 1:1 | 1:2 | 1:5 |
|---|---|---|---|
| 0.15 μm | S1 | S6 | S11 |
| 0.2 μm | S2 | S7 | S12 |
| 0.25 μm | S3 | S8 | S13 |
| 0.3 μm | S4 | S9 | S14 |
| 0.35 μm | S5 | S10 | S15 |

METHOD OF MANUFACTURING AN EB MASK FOR ELECTRON BEAM IMAGE DRAWING AND DEVICE FOR MANUFACTURING AN EB MASK

BACKGROUND OF THE INVENTION

1. Field of the Invention

The present invention relates to an electron beam image drawing device for forming a fine pattern on a semiconductor substrate by means of an electron beam; in particular, it relates to a method of manufacturing an image drawing mask employed in an electron beam image drawing device of the integrated-pattern (cell projection) type whereby a fine pattern can be formed at higher speed.

2. Description of the Related Art

With progress in LSI techniques, there have been rapid advances in increasing the fineness of circuit patterns formed on semiconductor devices. One method of forming fine patterns is image drawing using an electron beam. Such an electron beam image drawing system is a system that is effective for forming fine patterns of width less than 0.25 $\mu$m which are necessary in order to achieve even higher densities of integration of semiconductor circuits.

Figure 10:
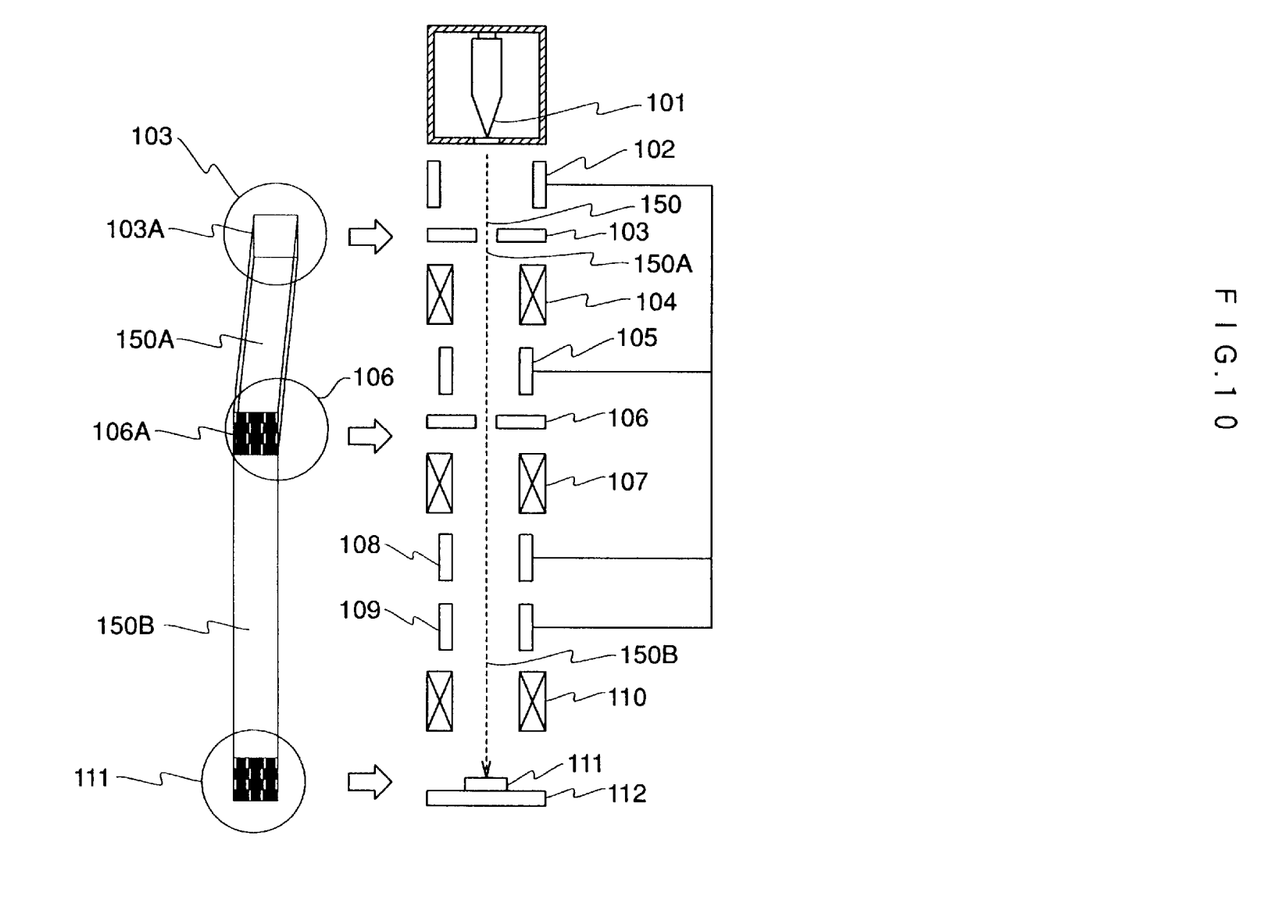
FIG. 10 is a layout diagram showing a prior art electron beam image-drawing device.

As an electron beam image drawing device, a device as shown in FIG. 10 may be employed. The electron beam image drawing device shown in FIG. 10 comprises a first aperture 103 formed with a rectangular aperture and an EB mask 106 formed with a plurality of basic aperture patterns 106A. This first aperture 103 and EB mask 106 have the function of forming an electron beam 150A into an electron beam 150B of a prescribed pattern. In particular, complex patterns can be drawn by a single exposure (integrated-pattern image drawing) by means of a basic aperture pattern 106A of EB mask 106. Electron beam 150B is directed on to a semiconductor substrate 111 covered with a resist (not shown), so that a fine pattern is formed in this resist.

As described above, in an integrated-pattern type electron beam image drawing device, an EB mask 106 is employed that is provided beforehand with a plurality of basic aperture patterns 106A. The basic aperture pattern 106A formed on this EB mask 106 was constituted by selecting a single cell portion of an identical pattern from among the fine patterns to be formed on semiconductor substrate 111. Conventionally, basic patterns were simply selected in the order of greatest repetition number from the fine patterns to be formed on semiconductor substrate 111. Several basic patterns were then determined, from the plurality of selected basic patterns, such that the number of shots needed to draw the entire semiconductor chip should be as few as possible. A basic aperture pattern 106A corresponding to the basic patterns that were thus determined was then formed on EB mask 106.

Also, it was necessary to select basic patterns such that basic aperture pattern 106A should contain as many fine patterns as possible, in order to reduce the number of shots when image drawing the entire semiconductor substrate 111. A plurality of types of basic aperture pattern 106A were therefore formed in the size allowed in EB mask 106. However, the above prior art example was subject to the following inconveniences. Specifically, when the aperture area of the basic aperture pattern 106A formed on EB mask 106 gets large, beam blur is produced, which lowers the image drawing quality (resolution) of the fine pattern. The reason for this is that the total beam current of electron beam 150B passing through EB mask 106 becomes large, resulting in a Coulomb effect being generated due to mutual repulsive force of the electrons contained in the electron beam.

Figure 11:
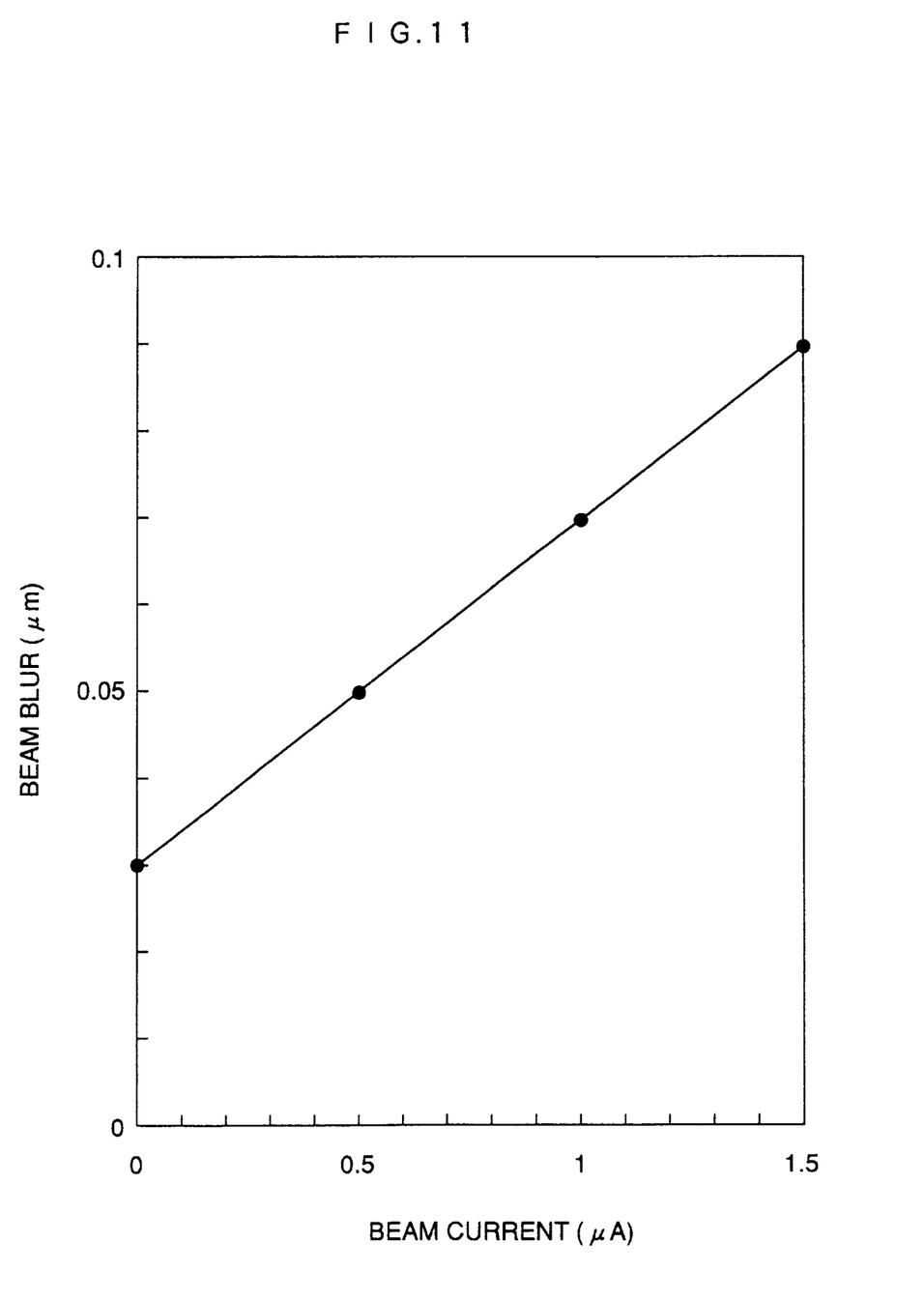
FIG. 11 is a diagram illustrating the relationship between beam current and beam blurring.

FIG. 11 shows the relationship between beam current of the electron beam and beam blur. As can be seen from this Figure, when the beam current gets large, beam blur of electron beam 150B becomes large, so formation of a fine pattern on semiconductor substrate 111 becomes difficult. With the conventional method of selecting a basic aperture pattern, no consideration at all was given to the aperture area of basic aperture pattern 106A formed on EB mask 106. It was therefore not possible to suppress the deterioration of image-drawing quality caused by the Coulomb effect.

SUMMARY OF THE INVENTION

An object of the present invention is to provide a method of manufacturing a mask for an electron beam image-drawing device whereby fine patterns can be formed. Also, an object of the present invention is to provide an integrated-pattern electron beam image drawing device whereby a fine pattern can be formed.

In order to achieve this object, an EB mask manufacturing method for electron beam image-drawing according to the present invention comprises the following steps. Specifically, cells containing a pattern whereby an EB mask is formed are extracted from design data stored in a means for storage. The aperture area of the aperture section required for the EB mask is then calculated using the design data contained in the extracted cell. A basic aperture pattern is then formed on the EB mask based on the cell data for aperture construction obtained by generating cell data for aperture construction in accordance with the value of this aperture area.

By the adoption of the above method, with the present invention, fine patterns can be formed without beam blurring (resolution deterioration), since determination of the optimum basic aperture pattern can be performed taking into consideration the area of the basic aperture cell of integrated-pattern exposure.

DESCRIPTION OF THE PREFERRED EMBODIMENTS

Figure 1:
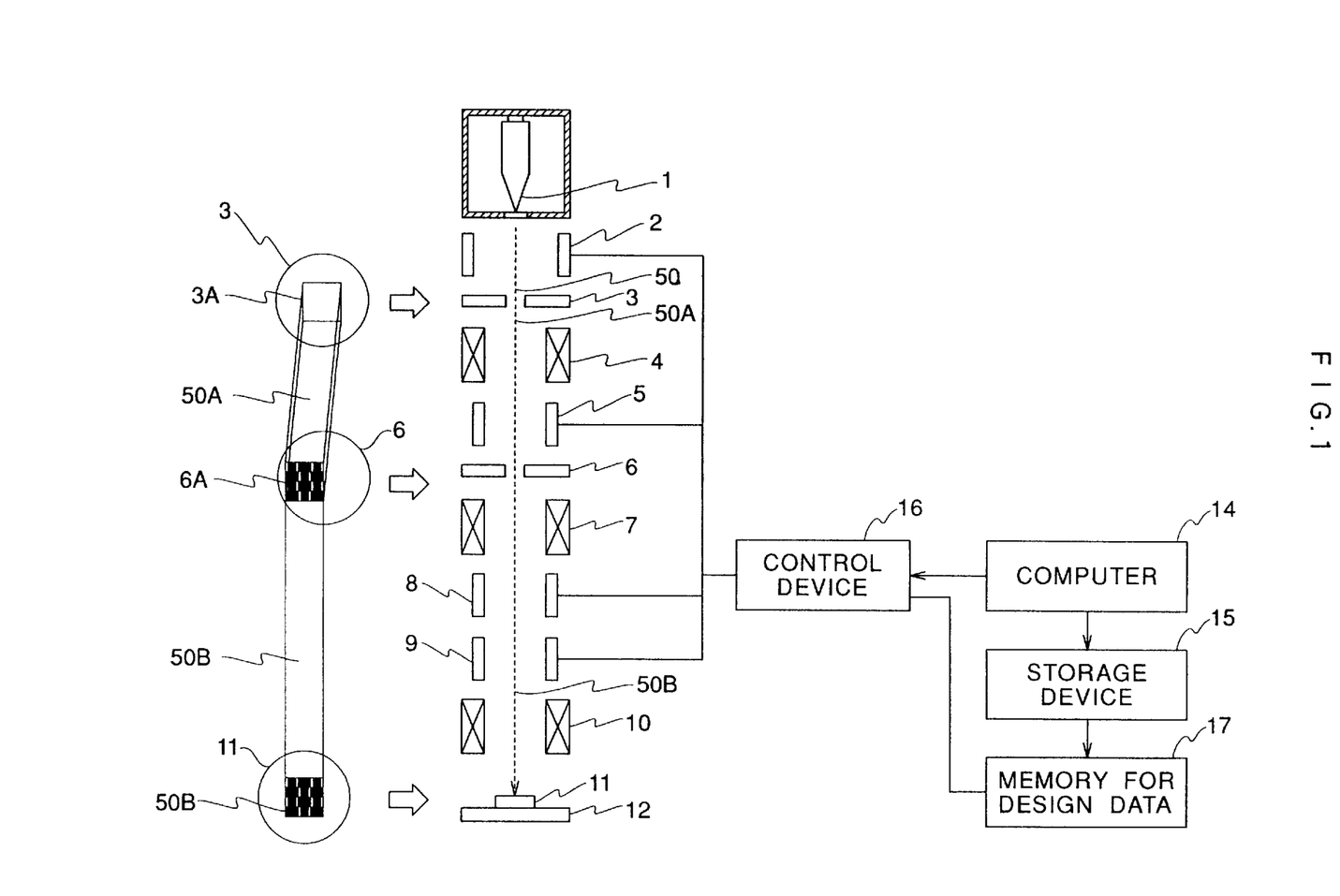
FIG. 1 is a layout diagram showing an electron beam image-drawing device according to the present invention.

A preferred embodiment of the present invention is described below with reference to FIG. 1. FIG. 1 is a diagram illustrating an electron beam image-drawing device of the integrated-pattern type according to the present invention.

The electron beam image-drawing device shown in FIG. 1 comprises an EB mask 6 formed with a first aperture 3 and basic aperture patterns 6A of a plurality of types. First aperture 3 is formed with a rectangular aperture 3A in order to form electron beam 50 emitted from electron gun 1 into rectangular-shaped electron beam 50A. EB mask 6 forms electron beam 50A into electron beam 50B having a prescribed fine pattern. Electron beam 50B is directed on to a resist (not shown) that is applied to a semiconductor substrate 11, and a fine pattern is thereby formed. A method of forming a basic aperture pattern 6A on EB mask 6 will be described later.

An electron beam image-drawing device is described in detail with reference to FIG. 1. Electron beam 50 emitted from electron gun 1 is directed on to semiconductor substrate 11 on stage 12 through blanking electrode 2, first aperture 3, forming lens 4, forming deflector 5, EB mask 6, condensing lens 7, main deflector 8, sub deflector 9, and projecting lens 10.

Basic aperture patterns 6A of a plurality of types are formed in EB mask 6. In these basic aperture patterns 6A, there are formed a plurality of respective aperture shapes corresponding to circuit patterns. Electron beam 50A formed into rectangular shape through a first aperture 3 are directed on to a specific basic aperture pattern 6A formed in EB mask 6. Electron beam 50B passing through these basic aperture patterns 6A are directed on to a resist that was applied to semiconductor substrate 11. A fine pattern corresponding to a basic aperture pattern 6A is drawn in a single shot on semiconductor substrate 11. That is, one or a plurality of fine patterns can be formed on the resist by a single image drawing process.

In FIG. 1, design data to serve as a standard for a fine pattern to be formed on a semiconductor substrate 11 is stored beforehand in storage device 15. Design data is read to memory 17 with storage device 15 being controlled by computer 14. After this, the processing necessary to convert the pattern data into image drawing data for image drawing is performed. This image drawing data is sent through control device 16 to blanking electrode 2, forming deflector 5, main deflector 8, and sub deflector 9. Electron beam 50B corresponding to the design data is thereby projected on to semiconductor substrate 11.

The number of shots necessary for drawing a fine pattern on to a semiconductor substrate 11 can thus be reduced to about 1/10~1/100 compared with the variable shaped beam type exposure device that was conventionally employed, by employing this integrated-pattern type of electron beam image drawing device. As a result, the time required for forming a fine pattern by electron beam is reduced, enabling throughput to be raised.

As described above, with an integrated-pattern type electron beam image drawing device, an EB mask 6 can be employed in which a plurality of basic aperture patterns 6A are provided beforehand. These basic aperture patterns 6A formed on this EB mask 6 are obtained by extracting basic repeating sections from the semiconductor design data. In other words, patterns are selected that appear at a plurality of locations on semiconductor substrate 11.

Figure 2:
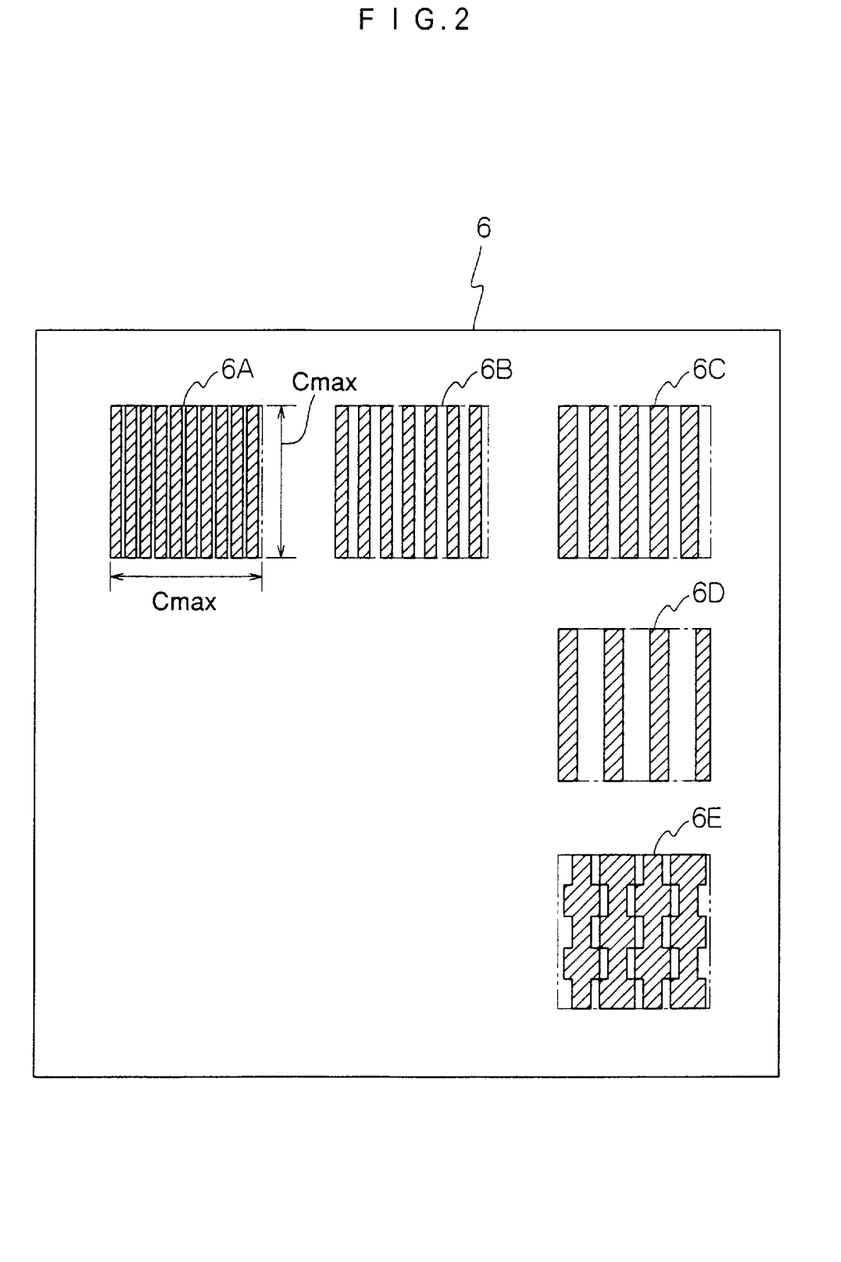
FIG. 2 is a plane view showing an EB mask constructed by an EB mask construction method according to a prior art.

Also, the method of extracting patterns such that as many patterns as possible can be included in basic aperture patterns 6A enables the number of shots required for image drawing the entire semiconductor substrate 11 to be reduced. Basic aperture patterns 6A can therefore be formed such as to approach the allowed size for an aperture on EB mask 6. FIG. 2 shows an example of an EB mask 6 constructed by such a method. Reference symbols 6A, 6B, 6C, 6D, and 6E are respectively the basic aperture patterns formed in EB mask 6.

Figure 3:
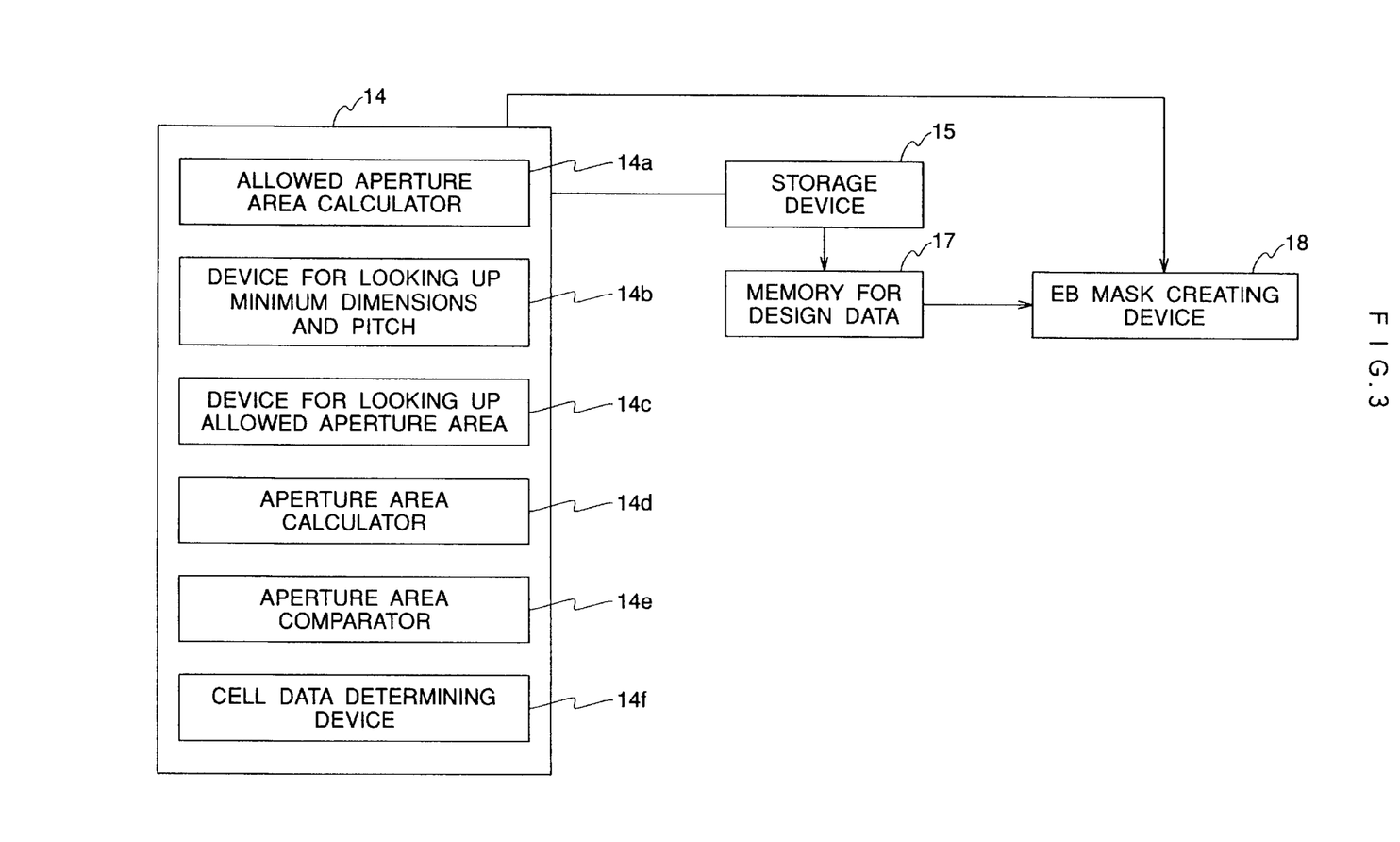
FIG. 3 is a layout diagram showing a device for constructing an EB mask.

FIG. 3 is a device for manufacturing an EB mask 6 employed in the electron beam image-drawing device of integrated-pattern type according to the present invention. Design data of fine patterning to be performed on semiconductor substrate 11 is stored beforehand in storage device 15. Specifically, the design data of the patterns contained in each cell when the fine pattern to be formed on semiconductor substrate 11 is divided up into a plurality of cells are stored. Also, number-of-repetitions data indicating at what locations of the semiconductor substrate as a whole the patterns obtained by this division process are to be formed are stored. In addition, information as to in what arrangement the patterns contained in each cell are to be drawn etc. is also recorded. Also, storage device 15 stores the minimum width Lmin and the pitch P of the pattern contained in the cell.

Also, the device for manufacturing EB mask 6 comprises a computer 14. This computer 14 comprises an allowed aperture area calculator 14a, a minimum line width/pitch lookup device 14b, an allowed aperture area lookup device 14c, an aperture area calculator 14d, and an aperture area comparator 14e. In addition, the device that manufactures EB mask 6 comprises a cell data determination device 14f that determines the cell data for aperture creation in accordance with the output of aperture area comparator 14e. A detailed description of the device for manufacturing EB mask 6 is given below.

Allowed aperture area calculator 14a calculates the aperture area Smax that is allowed for a single basic aperture pattern 6A. The allowed aperture area Smax of a basic aperture pattern 6A for integrated-pattern image drawing formed on EB mask 6 is determined by the minimum line width Lmin of a pattern contained in a single basic aperture pattern and the pitch (interval) P between adjacent patterns. Specifically, the allowed aperture area Smax gets smaller as the minimum line width (minimum width) Lmin of the basic aperture pattern 6A is decreased. Also, the allowed aperture area Smax decreases as the pitch between adjacent patterns gets smaller.

Figure 4:
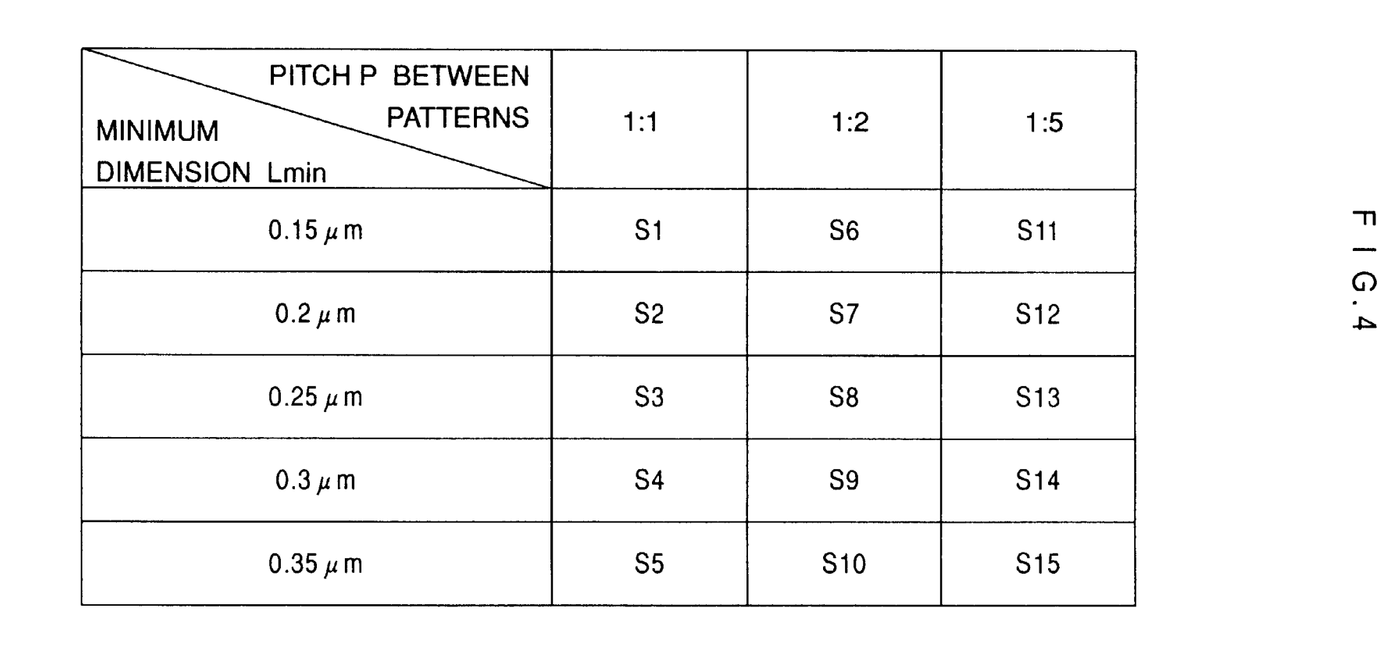
FIG. 4 is a table of the maximum allowed aperture area Smax of the basic aperture pattern in an embodiment of the present invention.

In the present invention, the value of Smax is found beforehand by allowed aperture area calculator 14a by selecting a number of types of combination of minimum line width Lmin and pitch P that are typically used. FIG. 4 is a table representing the allowed aperture areas Smax. In this table, the minimum line width is calculated in a range from 0.15 μm to 0.35 μm. On the other hand, the pitch is calculated as 1, 2 or 5 times the minimum line width Lmin. The calculated allowed aperture areas Smax are stored in the form of a table.

Also, minimum line width/pitch lookup device 14b in computer 14 looks up the information of minimum line width Lmin of the pattern contained in a selected cell and the pitch P. Also, computer 14 contains an allowed aperture area lookup device 14c that looks up the allowed aperture area Smax. This allowed aperture area lookup device 14c looks up the corresponding allowed aperture area Smax from the table of allowed aperture area Smax shown in FIG. 4, using the minimum line width Lmin and pitch P.

Also, aperture area calculator 14d provided in computer 14 calculates the aperture area S of the EB mask when the pattern contained in a specified cell has been provisionally formed in an EB mask, using the design data stored in storage device 15. This aperture area S can be calculated using the line width of the pattern and its length.

Further, aperture area comparator 14e provided in computer 14 compares the allowed aperture area Smax that is looked up from the table with the aperture area S of the actual pattern.

Figure 5:
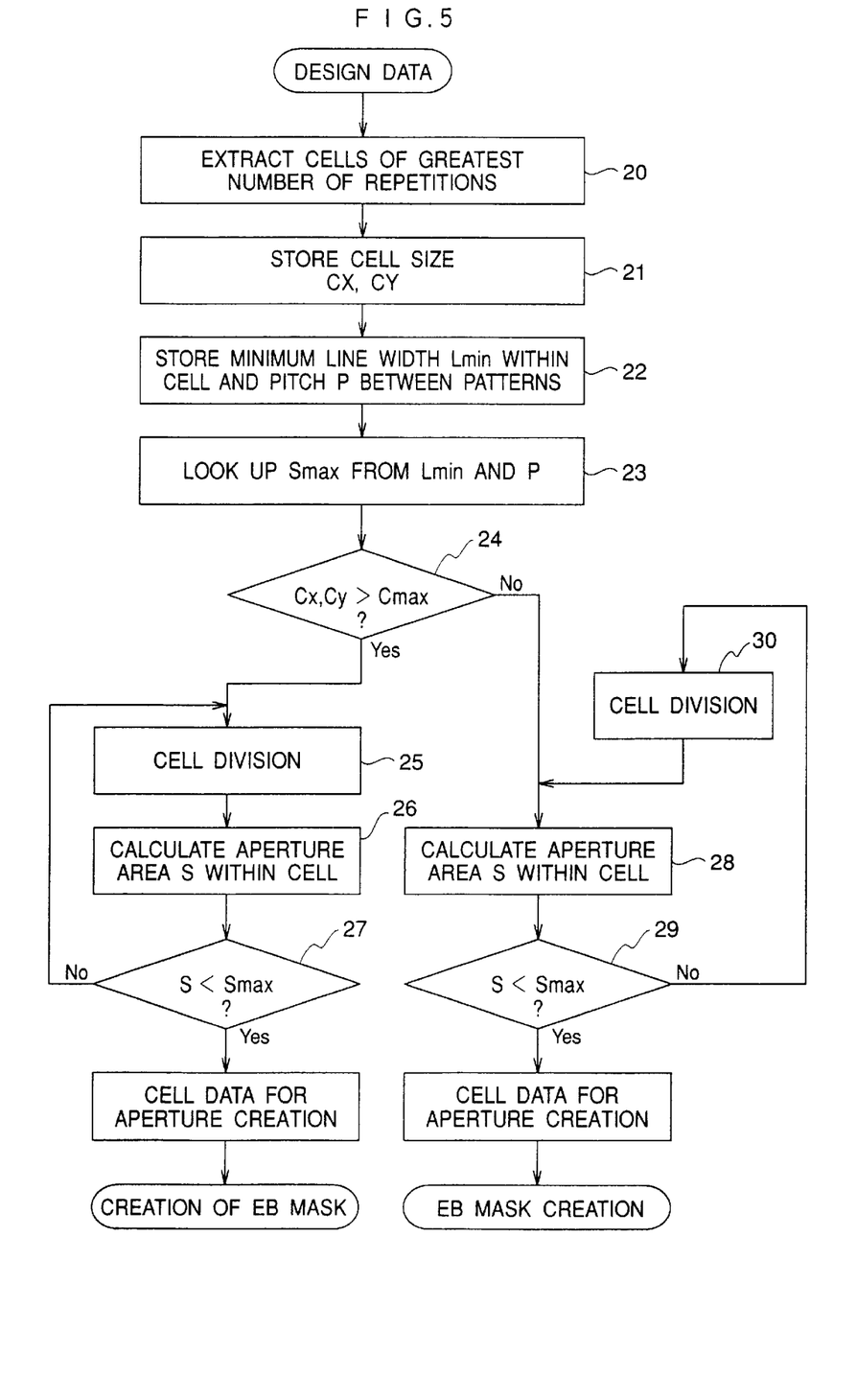
FIG. 5 is a view given in explanation of a process for extracting a basic aperture pattern in a method of constructing an EB mask according to the present invention.

Next, a method of determining a basic aperture pattern for integrated-pattern image drawing formed in EB mask 6 will be described with reference to FIG. 5.

First of all, in step 20, from the plurality of cells constituting design data of fine patterns to be formed on semiconductor substrate 11, those cells are extracted whose repetition numbers (reference numbers) are greatest. Then, in the next step 21, the sizes Cx, Cy (longitudinal and transverse) of the extracted cells are stored. Next, in step 22, the minimum line width Lmin of the pattern contained in the cell and the pitch P between adjacent patterns are stored.

Next, as shown in step 23, the allowed aperture area Smax is looked up from the pitch P and minimum line width Lmin of the pattern contained in the cell extracted in step 20. In step 24, it is determined whether the cell sizes Cx, Cy are larger than Cmax or not. Cmax is the maximum length of one side of a basic aperture pattern that can be formed on EB mask 6. Various different values of this Cmax may be fixed, depending on the device that is used to manufacture EB mask 6.

If the cell size Cx, Cy is larger than Cmax, in step 25, cell division is performed. If for example there are eight patterns in the cell, this cell division could be division into two, namely, one set of four patterns and another set of four patterns, or division into four, namely, four sets of two patterns each. In other words, the patterns contained in the cell are evenly apportioned.

Next, in step 26, the aperture area S within the cell after division is calculated, and this is compared (step 27) with the allowed aperture area Smax that was looked up in step 23. If the aperture area S is smaller than the allowed aperture area Smax, it is directly employed as the cell data for creation of a basic aperture pattern. On the other hand, if S is larger than Smax, processing returns to cell division in step 25, until it becomes smaller than Smax.

On the other hand, if, by the comparison in step S24, it is found that Cx and Cy are smaller than Cmax, cell division is not performed and the aperture area S of the cell is found directly (step 28). Further, the aperture area S is compared with the Smax that was looked up in step 23 (step 29) and, if S is smaller than Smax, it is directly determined as cell data for aperture creation for the basic aperture pattern. Conversely, if S is larger than Smax, cell division is performed (step 30). Such cell division is repeated until S gets smaller than Smax.

Figure 7:
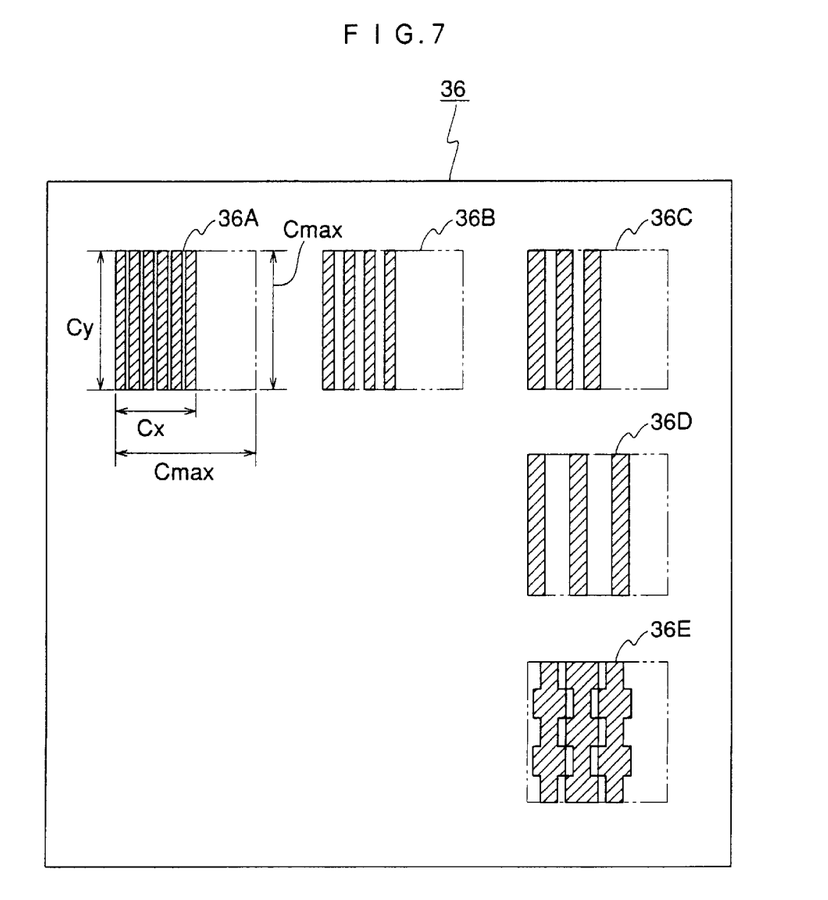
FIG. 7 is a plane view showing an EB mask constructed by the method shown in FIG. 5.

Using the cell data for aperture creation information determined by the above method, an EB mask 6 is created by means of EB mask creating device 18. That is, a basic aperture pattern is created in the EB mask using this cell data for aperture creation. FIG. 7 shows an example of an EB mask 36 created using the flow chart of FIG. 5.

A further example of a method of determining a basic aperture pattern for integrated-pattern image drawing to be formed in mask 6 is described with reference to FIG. 8. Steps which are the same as steps shown in FIG. 5 are described with the same numbers.

Figure 8:
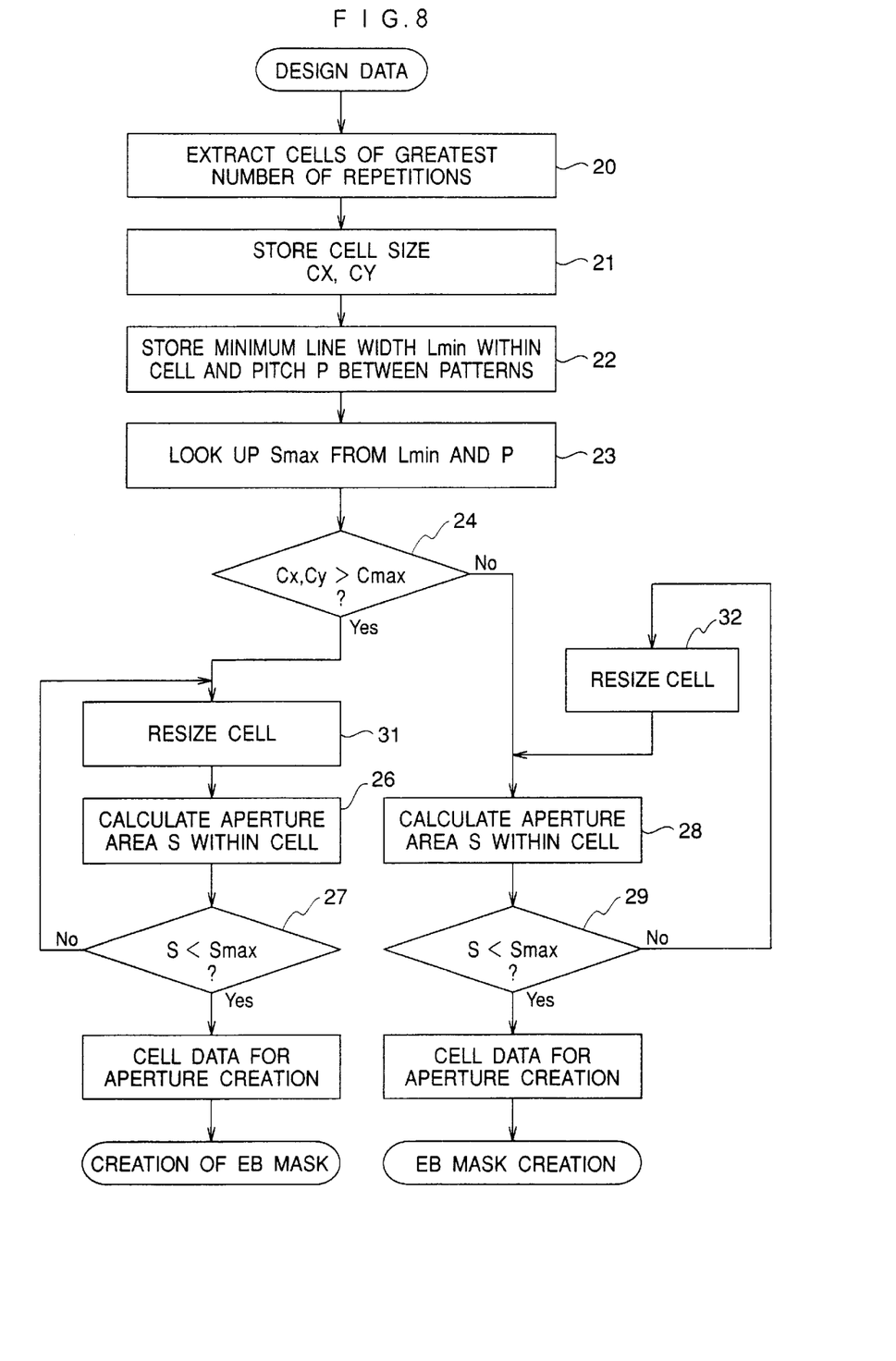
FIG. 8 is a diagram given in explanation of a further example of a process for extracting a basic aperture pattern in a method of constructing an EB mask according to the present invention.

First of all, in step 20 of FIG. 8, from among the cells in respect of which design data of the fine patterns constituting the semiconductor substrate are constituted, those cells of highest repetition number (reference number) are extracted. Then, in the next step 21, the sizes Cx, Cy (longitudinal and transverse) of the extracted cells are stored. Further, in step 22, the minimum line width Lmin of the pattern contained in the cells and the pitch P between adjacent patterns are stored.

Next, as shown in step 23, Smax is looked up from the pitch P and minimum line width Lmin of the pattern contained in the cell extracted in step 20. In step 24, a determination is made as to whether the cell sizes Cx, Cy are larger than Cmax or not. Cmax is the maximum length of one side of a basic aperture pattern that can be formed in EB mask 6. Various different values are determined for this Cmax depending on the device used to create the EB mask 6.

If the sizes Cx, Cy of the cell are larger than Cmax, in step 31, cell resizing (size reduction) is performed. Cell resizing means that if for example the cell contains 8 patterns, it is divided into cells of 6 patterns and 2 patterns. In other words, the patterns contained in the cell are divided up, little by little, without necessarily making equal divisions.

Next, in step 26, the aperture area S in the cell after division is calculated and compared (step 27) with the size of the allowed aperture area Smax that was looked up in step 23. If S is smaller than Smax, it is directly employed as cell data for creation of the basic aperture pattern. On the other hand, if S is larger than Smax, resizing in step 25 is repeated until S is smaller than Smax.

On the other hand, if Cx or Cy is found to be smaller than Cmax by the comparison in step 24, the aperture area S of the cell is directly found (step 28). Further, the aperture area S is compared with (step 29) Smax that was looked up in step 23, and, if S is smaller than Smax, this is directly determined as cell data for the basic aperture pattern. Conversely, if S is larger than Smax, resizing is performed (step 32). This resizing is repeated until S becomes smaller than Smax.

Figure 6:
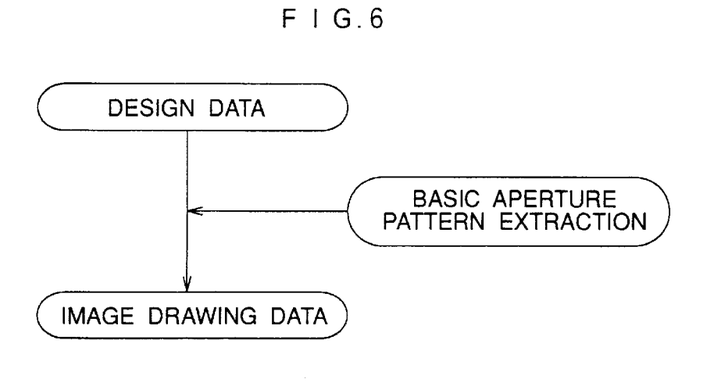
FIG. 6 is a diagram showing a process for converting design data to image-drawing data.
Figure 9:
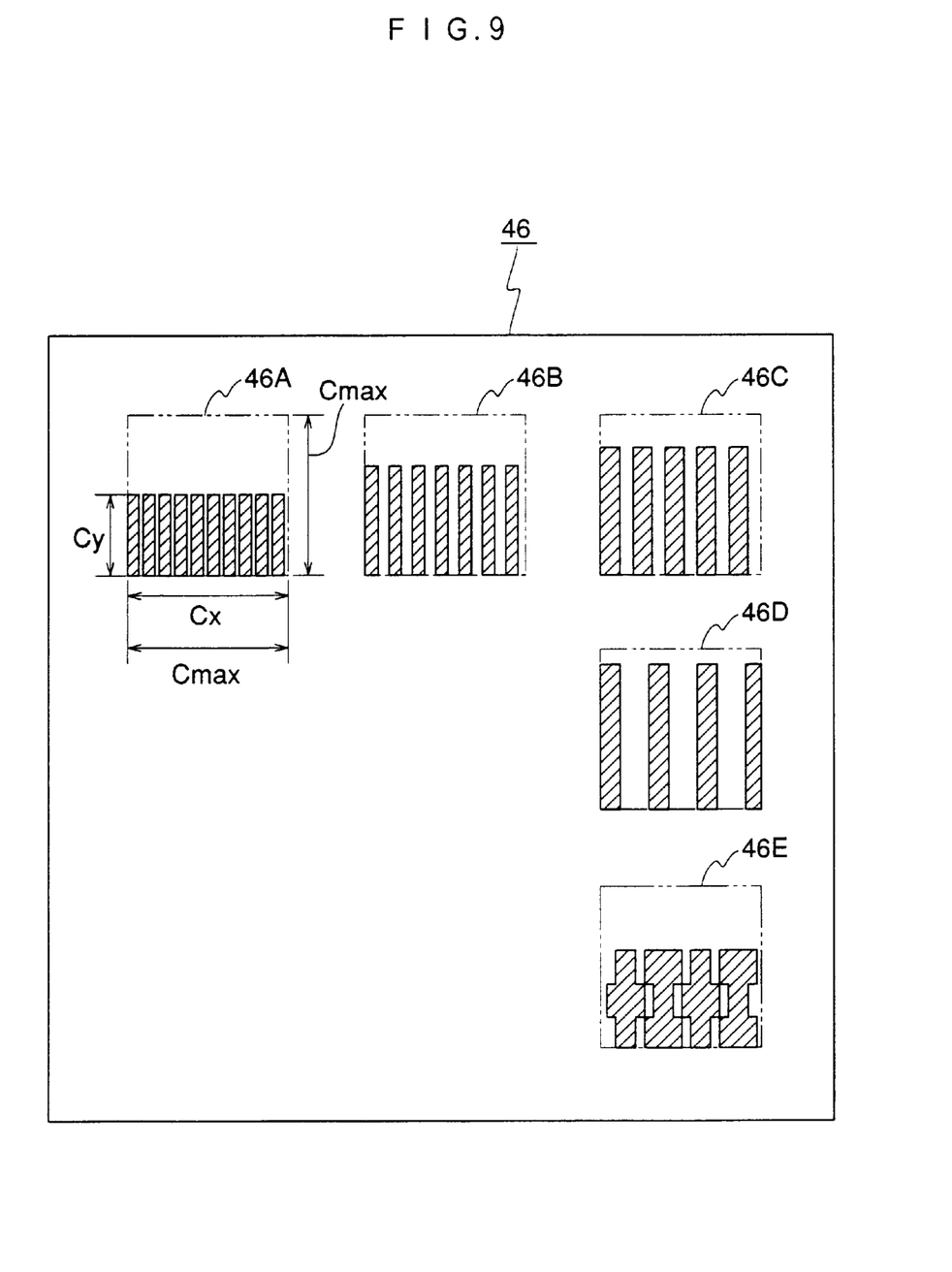
FIG. 9 is a plane view showing an EB mask manufactured by the method shown in FIG. 8.

EB mask 6 is created using the cell data for aperture creation information of the basic aperture pattern extracted by the above method. When this cell data for aperture creation has been determined, just as in the case shown in FIG. 6, a basic aperture pattern can be created based on the cell data for aperture creation of this basic aperture pattern. FIG. 9 is an example of an EB mask 46 created in accordance with the flow chart of FIG. 8.

As described above, with the present invention, optimum cell data for aperture creation is extracted whilst taking into account the aperture area of the basic aperture pattern for integrated-pattern drawing. Consequently, even when forming fine patterns, fine patterns of high precision can be formed without beam blur (resolution deterioration). As a result, an EB mask can be provided that is effective for the manufacture of semiconductors of high degree of integration for which narrower line widths are demanded.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 9-007833(Filed on Jan. 20th, 1997) including specification, claims, drawings and summary are incorporated herein by reference in its entirety.

What is claimed is:

1. A method of creating an EB mask for electron beam image drawing, comprising:

extracting a cell containing a pattern for forming on the EB mask from design data stored in a means for storage;

calculating an aperture area of an aperture section required in the EB mask using the design data contained in the extracted cell;

generating cell data for aperture creation using the value of the aperture area; and forming a basic aperture pattern in the EB mask using the cell data for aperture creation.

2. The method of claim 1 wherein the extracted cell is selected from those cells having the greatest number of repetitions in the design data.

3. The method of claim 1, wherein the design data contains a pattern line width and length and the area of the aperture section is calculated using the pattern line width and length.

4. A method of creating an EB mask for electron beam image drawing comprising:

extracting a cell containing a pattern for forming on the EB mask from design data stored in a means for storage;

calculating the aperture area of an aperture section required in the EB mask using the design data;

looking up the pitch of an adjacent pattern and minimum line width of a pattern contained in the cell, using the design data;

looking up the allowed aperture area of a basic aperture pattern using the minimum line width and pitch;

comparing the allowed aperture area and the calculated aperture area;

generating cell data for aperture creation on the basis of the comparison; and forming a basic aperture pattern on the EB mask using the cell data for aperture creation.

5. The method of claim 4, wherein the extracted cell is selected from those cells having the greatest number of repetitions in the design data.

6. The method of claim 4, wherein the design data contains a pattern line width and length and the area of the aperture section is calculated using the pattern line width and length.

7. The method of claim 4, wherein, if the calculated aperture area is larger than the allowed aperture area, the cell is divided and cell data for aperture creation are generated on the basis of the divided cell.

8. The method of claim 7, wherein cell division is repeated until the calculated aperture area is smaller than the allowed aperture area.

9. The method of claim 7, wherein, in cell division, the patterns contained in the cell are equally divided.

10. The method of claim 4, wherein if the size of the extracted cell is larger than a prescribed value the cell is divided prior to calculating the aperture area of the aperture section.

11. A method of creating an EB mask for electron beam image drawing comprising:

extracting cells containing patterns to be formed on the EB mask from design data stored in a means for storage;

calculating the aperture area of an aperture section required in the EB mask using the design data;

looking up the pitch of an adjacent pattern and minimum line width of a pattern contained in the cell using the design data;

calculating the allowed aperture area of a basic aperture pattern using the minimum line width and pitch;

comparing the allowed aperture area and the calculated aperture area;

resizing the cell in accordance with the comparison;

generating cell data for aperture creation using the resized cell; and forming a basic aperture pattern on the EB mask using the cell data for aperture creation.

12. The method of claim 11, wherein the extracted cell is selected from those cells having the greatest number of repetitions in the design data.

13. The method of claim 11, wherein the design data contains a pattern line width and length and the area of an aperture section is calculated in accordance with the line width and length.

14. The method of claim 11, wherein if the calculated aperture area is larger than the allowed aperture area, the cell is resized, and cell data for aperture creation are generated on the basis of the resized cell.

15. The method of claim 14, wherein cell division is repeated until the aperture area becomes smaller than the allowed aperture area.

16. The method of claim 11, wherein cell resizing is performed by dividing one portion of a pattern contained in a cell.

17. The method of claim 11, wherein, if the area of the extracted cell is larger than a prescribed value, the cell is resized prior to calculating the area aperture of the aperture section.

* * * * *